(12) United States Patent
Franz

(10) Patent No.: US 10,660,231 B2
(45) Date of Patent: May 19, 2020

(54) COUPLING A POWER MODULE TO A POWER DISTRIBUTION RACK

(71) Applicant: HEWLETT PACKARD ENTERPRISE DEVELOPMENT LP, Houston, TX (US)

(72) Inventor: John Franz, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/072,156

(22) PCT Filed: Jan. 29, 2016

(86) PCT No.: PCT/US2016/015751
§ 371 (c)(1),
(2) Date: Jul. 23, 2018

(87) PCT Pub. No.: WO2017/131766
PCT Pub. Date: Aug. 3, 2017

(65) Prior Publication Data
US 2019/0037724 A1   Jan. 31, 2019

(51) Int. Cl.
H05K 7/14       (2006.01)
G06F 1/18       (2006.01)
H01R 25/00      (2006.01)

(52) U.S. Cl.
CPC .......... *H05K 7/1457* (2013.01); *G06F 1/181* (2013.01); *G06F 1/189* (2013.01); *H01R 25/006* (2013.01); *H05K 7/1492* (2013.01)

(58) Field of Classification Search
CPC ...... H05K 7/1457; H05K 7/1492; H05K 7/14; H05K 5/0247; H05K 1/0262; H01R 25/00; H01R 25/006; H01R 13/5841; G06F 1/18; G06F 1/181; G06F 1/189; G06F 1/26; G06F 1/266; G06F 1/263; G06F 11/3062; G06F 2200/261; G06F 1/188
USPC .............. 361/622, 679.02, 601, 679.01, 752; 439/652
See application file for complete search history.

(56) References Cited

U.S. PATENT DOCUMENTS

| | | |
|---|---|---|
| 6,229,691 B1 | 5/2001 | Tanzer |
| 6,937,461 B1 | 8/2005 | Donahue |
| 7,400,493 B2 | 7/2008 | Ewing |
| 7,777,365 B2 | 8/2010 | Cleveland |
| 8,416,565 B1 | 4/2013 | Ross |
| 8,817,463 B1 | 8/2014 | Rose |
| 8,876,548 B2 | 11/2014 | Doorhy |
| 9,141,154 B2 | 9/2015 | Champion |

(Continued)

OTHER PUBLICATIONS

PCT/ISA/KR, International Search Report, dated May 19, 2016, PCT/US2016/015751, 12 pages.

*Primary Examiner* — Mandeep S Buttar
(74) *Attorney, Agent, or Firm* — Hewlett Packard Enterprise Patent Department

(57) ABSTRACT

Examples herein disclose a power system including a power distribution unit (PDU) rack and a power module. The PDU rack is positioned in vertically in a server rack to distribute power to the power module. The power module is positioned horizontally in a server rack and includes multiple connectors. The power module is coupled perpendicularly to the PDU rack and receives power cables for delivering power to multiple servers in the server rack.

4 Claims, 6 Drawing Sheets

(56) References Cited

U.S. PATENT DOCUMENTS

| | | | |
|---|---|---|---|
| 2001/0026436 A1* | 10/2001 | Tanzer | H01R 25/006 361/610 |
| 2004/0000815 A1* | 1/2004 | Pereira | G06F 1/189 307/11 |
| 2008/0093927 A1* | 4/2008 | Ewing | H05K 7/1492 307/23 |
| 2009/0116178 A1 | 5/2009 | Champion | |
| 2009/0242265 A1* | 10/2009 | Doorhy | H01R 25/006 174/494 |
| 2010/0328849 A1* | 12/2010 | Ewing | G06F 1/266 361/622 |
| 2011/0073726 A1* | 3/2011 | Bergesch | H05K 7/183 248/201 |
| 2012/0162910 A1* | 6/2012 | Jai | H05K 7/1492 361/679.58 |
| 2015/0214683 A1 | 7/2015 | Irons | |
| 2016/0197504 A1* | 7/2016 | Hsia | H02J 7/0045 307/23 |
| 2017/0201076 A1* | 7/2017 | Chen | H05K 7/1492 |

* cited by examiner

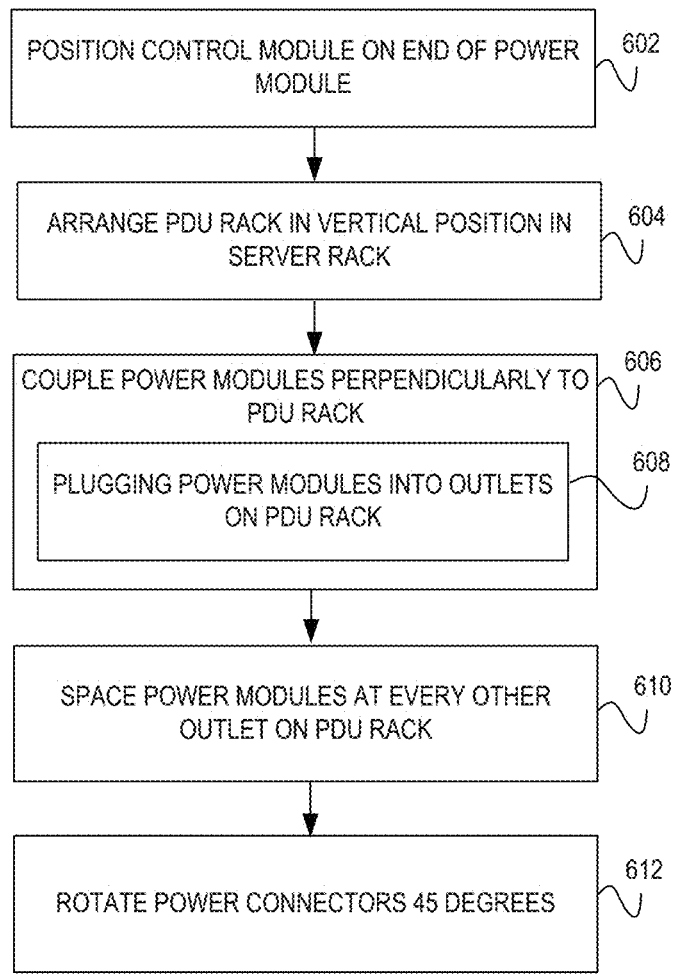

COUPLING A POWER MODULE TO A POWER DISTRIBUTION RACK

BACKGROUND

A server rack, also referred to as a rack-mounted server, is a data center dedicated to multiple servers in a standardized frame or enclosure. The frame, also known as a rack, contains multiple mounting slots or bays, each designed to hold one of the multiple servers.

BRIEF DESCRIPTION OF THE DRAWINGS

In the accompanying drawings, like numerals refer to like components or blocks. The following detailed description references the drawings, wherein:

FIGS. 5-6 illustrate example flow diagrams for manufacturing a power system such that a power module is coupled perpendicularly to a PDU rack in accordance with the present disclosure.

DETAILED DESCRIPTION

A rack-mounted server contains multiple slots, each designed to hold a server stacked above one another. The rack-mounted server includes a power distribution unit (PDU) rack or strip which provides a power connection to each of the servers. As such, the PDU rack or main distribution unit (MDU) is comprised of vertical strips with a number of outlets to provide power to the servers. However, the outlets are limited in quantity and the cable routing from each server to each respective outlet has design challenges. For example, there is a tight tolerance space between each server and the PDU strip. This tight tolerance space makes it difficult to route the cable from each server to each power outlet on the PDU strip. Additionally, the cables may experience additional stresses, such as an increased bend radius to reach the PDU strip.

To address these issues, examples disclose a power system installed in a server rack which increases a number of outlets and eases cabling issues. The power system includes a PDU rack positioned vertically in a server rack and a power module. The power module includes a number of power connectors (e.g., outlets) which are coupled to the PDU rack such that the power module is coupled perpendicularly to the PDU rack. The power connectors on the power module receive power cables for delivering power to the servers. Including the power module with the power connectors increases a number of power outlets available within the server rack. Additionally, coupling the power module perpendicularly to the PDU rack, creates a "rung" that allows easier access for power cables to couple to each power outlet. Further increasing the number of power outlets, provides a customization for a data center to be designed for a customer's needs.

In another example, the power system includes multiple power modules which are spaced at every other outlet on the PDU rack or strip. In this example, spacing the power modules to every other outlet on the PDU rack provides adequate space between the tiered power connectors. Providing adequate space, allows the power cables to easily access the power connectors without additional design implementations.

In a further example, each of the power connectors on the power module rotates at least 45 degrees. Rotating each of the power connectors at least 45 degrees decreases a bend radius on the power cables, thus reducing the stressors on cable routing. Additionally, rotating the power connectors eases the use of installing power cables from each of the servers.

Figure 1B:
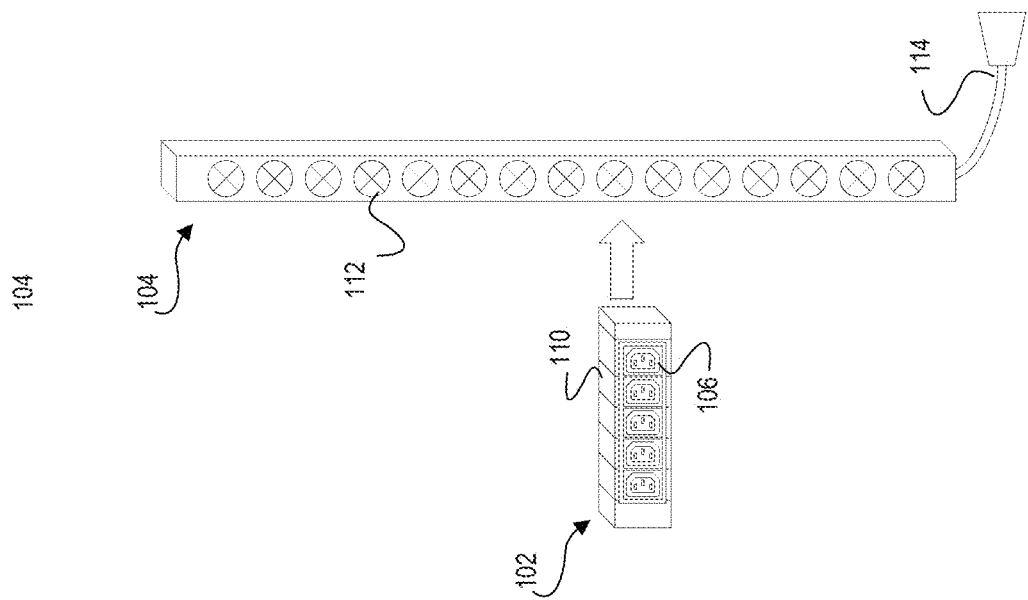
FIGS. 1A-1B illustrate perspective views of an example power module in accordance with the present disclosure.
Figure 1A:
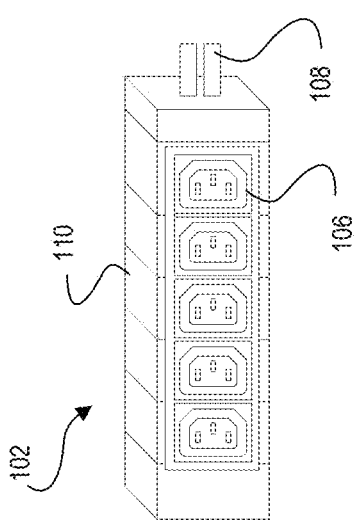

FIGS. 1A-1B illustrate various views of an example power module 102 and power distribution unit (PDU) rack 104. The power module 102 includes multiple power connectors 106 and an enclosure 110 to surround the internal components and circuitry of the power module 102. Additionally, the power module 102 includes an inlet 108 to couple to one of multiple outlets 112 on the PDU rack 104. The power module 102 and PDU rack 104 illustrate a power system within a server rack for distributing power to multiple servers. As such, the server rack (not illustrated) includes multiple servers (not illustrated) with respective power cables. The power cables are received by the power connectors 106 on the power module 102. This implementation is discussed in detail in a later figure. Implementations of the power system include, by way of example, a power generator, power circuit, embedded system, power supply system, distributed power system, or other type of power system capable of providing power to multiple servers in the server rack. Although FIGS. 1A-1B illustrate the power module 102 as a singular component, implementations should not be limited as this was done for illustration purposes. For example, there may be multiple power modules for coupling to the PDU rack 104 as part of the power system.

In FIG. 1A, the power module 102 includes the multiple power connectors 106, the inlet 108, and the enclosure 110. The power module 102 couples perpendicularly to the PDU rack 104 and as such is positioned horizontally in the server rack. In an implementation, multiple power modules couple perpendicularly to the PDU rack 104 such that each power module implements a projection tier level that serves as a "rung" of a ladder. The power module 102 receives power cables at the power connectors 106 that upon the coupling of the cables to the power connectors 106, the power module 102 delivers power to each server. In another implementation, a control module is included on the power module 102 on an end opposite to an end coupling to the PDU rack 104. In this implementation, the control module includes a circuit breaker and visual indication to regulate and manage an amount of power distributed to the multiple servers installed within the server rack. In an additional implementation, the power module 102 rotates 45 degrees inward toward the installed servers. These implementations may be discussed in detail in a later figure. Implementations of the power module 102 include, by way of example, a power brick, power receptacle, power box, or other type of device capable of coupling to the PDU rack 104 for providing power to servers in the server rack.

The power connectors 106 are devices which permit an electrical current through from the power module 102 to servers in the server rack. As such, each power connector 106 serves as receptacle to connect the server by way of a power cable to the PDU rack 104. Since the power module 102 includes multiple connectors 106, upon the coupling of the power module 102 to one of the outlets 112 increases the number of power connectors within the server rack. Increasing the number of power connectors allows the server rack to power additional resources and/or servers. In another implementation, each of the power connectors 106 rotate at least 45 degrees for flexibility to couple power cables to the power connectors 106. These implementations are discussed in detail in later figures. Implementations of the power connectors 106 include electrical outlets, receptacles, sockets, plugs, jackets, or other type of device capable to connecting the servers to the PDU rack 104 for power distribution.

The inlet 108 is a device for connecting the power module 102 directly to the PDU rack 104. Upon the coupling of the inlet 108 to one of the outlets 112 on the PDU rack 104, an electrical connection is established between the power module 102 and PDU rack 104. The electrical connection allows the flow of electrons and hence power distribution from the PDU rack 104 to the power module 102. Upon a coupling of a server to the power module 102 by way of power cable, the power is distributed to the server. In an implementation, the inlet 108 couples to one of the outlets 112 on the PDU rack that supports plug and play capabilities. Plug and play capabilities allow the power module 102 to couple to the respective outlet 112 on the PDU rack without regard to a specific order or arrangement of the coupling. In this implementation, the power module 102 is movable to other outlets 112 on the PDU rack 104 without taking additional action. Although the inlet 108 in FIG. 1A is illustrated as two different protruding members, this was done for illustration purposes. As such, the inlet 108 may comprise a single protruding member or other type of connection device to establish the connection between the PDU rack 104 and the power module 102. In a further implementation, the power module 102 includes a tethered connection so the electrical connection remains persistent while servicing the power connectors 106. In this implementation, the power module 102 may include a spring retractable member to couple to the PDU rack 104. Yet in another implementation, the inlet 108 may also provide a data connection in addition to the electrical connection to pass communications through the PDU rack 104 over the functionality of the power module 102. Implementations of the inlet 108 includes, by way of example, an adapter, connector, retractable member, spring loaded connection, socket, jack, plug, or other type of mechanism to electrically connect the power module 102 to the PDU rack 104.

The enclosure 110 is a structure used to encase power cables and other components internal to the power module 102. The enclosure 110 includes multiple walls and ends to construct the infrastructure for encasing the power module 102. One of the ends of the enclosure 110 supports the inlet 108 for coupling to the PDU rack 104. The other end (opposite to the end coupled to the PDU rack 104) supports the control module. The enclosure 110 is composed of a safety material to ground extraneous power and to prevent noise distribution through the power module 102. As such, the enclosure 110 is composed of various materials including metal, plastic, polyurethane, or other type of power and noise isolating material.

In FIG. 1B, the power module 102 couples to one of the outlets 112 on the PDU rack 104. The PDU rack 104 is positioned in a vertical manner, while the power module 102 is positioned in horizontal manner. As such, the power module 102 is considered perpendicular to the PDU rack 104 and the outlet 112. In this implementation, the power module 102 is positioned at right angle (e.g., 90 degrees) to the PDU rack 104.

The PDU rack 104 is a vertical power conduit which distributes power to the power module 102 upon the coupling of the inlet 108 to the outlet 112. The PDU rack 104 is the main distribution unit fitted with multiple outlets for distributing electrical power to the servers and other networking equipment located in the server rack. Accordingly, the PDU rack 104 includes a power input 114 in which to receive power for distribution through outlets 112. The PDU rack 104 includes a framework including the walls, rails, bars, or other type of infrastructure for holding the power cables used to distribute the electrical power from the power input 114 to the outlets 112. The height of the PDU rack 104 varies to accommodate the number of outlets 112. For example, a greater number of outlets 112 increases the height of the PDU rack 104

The outlets 112 are receptacle sockets that connect to the power modules such that the power from the PDU rack 104 is distributed to the power modules. In one implementation, each outlet 112 consists of wires to connect to the power module 102 while another implementation of each outlet 112 includes an electrical socket to connect to the power module 102. The outlets 112 are installed on at least one side or wall of the PDU rack 104 to provide multiple connections to various power modules. Each installed power module creates a projection tier level, that include sufficient space (e.g., at least one outlet) between tiers. The sufficient space provides enough clearance and thus less stress on the power cables from the servers. In a further implementation, multiple power modules are installed or spaced at every other outlet on the PDU rack 104. In this implementation, an empty or uncoupled outlet is between two power modules. Leaving an uncoupled outlet provides enough clearance of installation of the power cables from the servers into the power connectors 106 on the power module 102. This implementation is discussed in detail in the next figure. Although the PDU rack 104 illustrates a specific number of outlets 112, implementations should not be limited as this was done for illustration purposes.

Figure 2B:
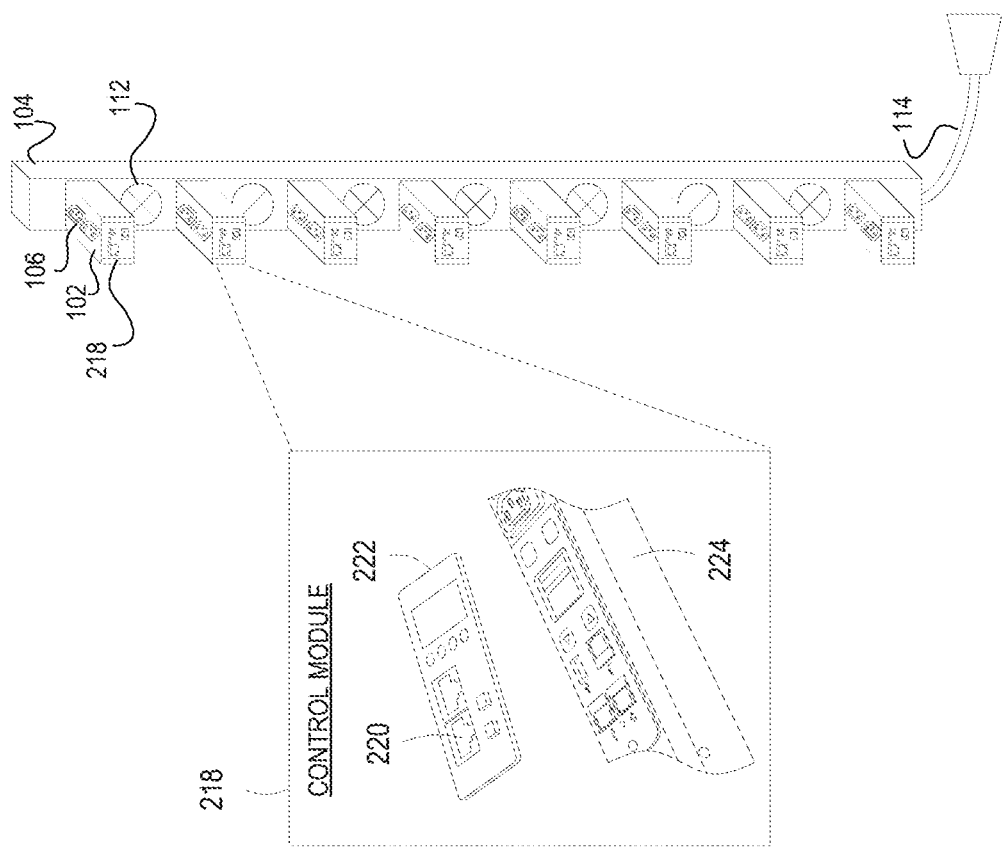
FIGS. 2A-2B illustrate perspective views of an example power system including multiple power modules coupled to a power distribution unit (PDU) rack in accordance with the present disclosure.
Figure 2A:
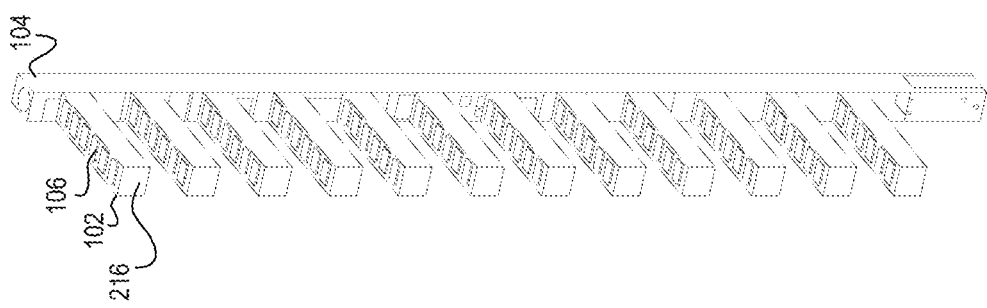

FIGS. 2A-2B illustrate various perspectives of an example power system including power modules 102 coupled to a PDU rack 104. Each power module 102 includes an end cap 216 which faces out for installation of a control module 218. The control module 218 is located on the end opposite to the end coupled to the PDU rack 104. Additionally, each power module 102 is installed at every other outlet on the PDU rack 104, meaning there is an unoccupied or uncoupled outlet 112 between power modules 102.

In FIG. 2A, the power modules 102 are angled to illustrate how each power module 102 creates a different tiered rung on the PDU rack 104. Each power module 102 includes multiple power connectors 106 located on a top portion. The power modules 102 are populated at every other outlet on the PDU rack 104 to leave additional space or room for power cables ingress and egress from the top portion of each respective power module 102. Each power module 102 includes the end cap 216 which is part of the enclosure illustrated in FIG. 1. Although FIG. 2A illustrates the end cap 216 without the control module 218, this was done for illustration purposes to depict the multiple tiered rungs on the PDU rack 104.

In FIG. 2B, multiple power modules 102 are coupled to the PDU rack 104 with the unoccupied outlet 112 located between power modules 102. Each power module 102 may include control module 218 located on the end cap 216. The control module 218 is positioned on the end cap 216 of each power module 102 opposite to the PDU rack 104. The control module 218 may include a network connection 220, visual indication 222 representing an amount of power being distributed by each of the power module 102, and a circuit breaker 224 to regulate the amount of power distribution. In this implementation, the control module 218 provides a smart powered function that may include power meters, network connections, circuit breakers, and/or controllers to manage power distribution to the servers. As such FIG. 2B illustrates the example variations of the control module 218. For example, the control module 218 may include the network connection 220, the visual indication 222, and/or the circuit breaker 224. The network connection 220 is a port which offers access to the networking system. The visual indication 222 is representation illustrating the amount of power being distributed to the servers at a given time. Although the visual indication 222 is represented by a display, implementations include a light emitting diode (LED) or other type of visual representation of the amount of power being distributed to the servers. The circuit breaker 224 is a device which prevents the flow of current or power to the servers if there is an overflow of the power. In this regard, the circuit breaker 224 operates as a safety regulation in the power module 102 to regulate the amount of power to the servers. Each component 220, 222, and 224 on the control module 218 is managed by a controller (not illustrated) to determine the amount of power being distributed through the power module 102 at a given time.

Figure 3:
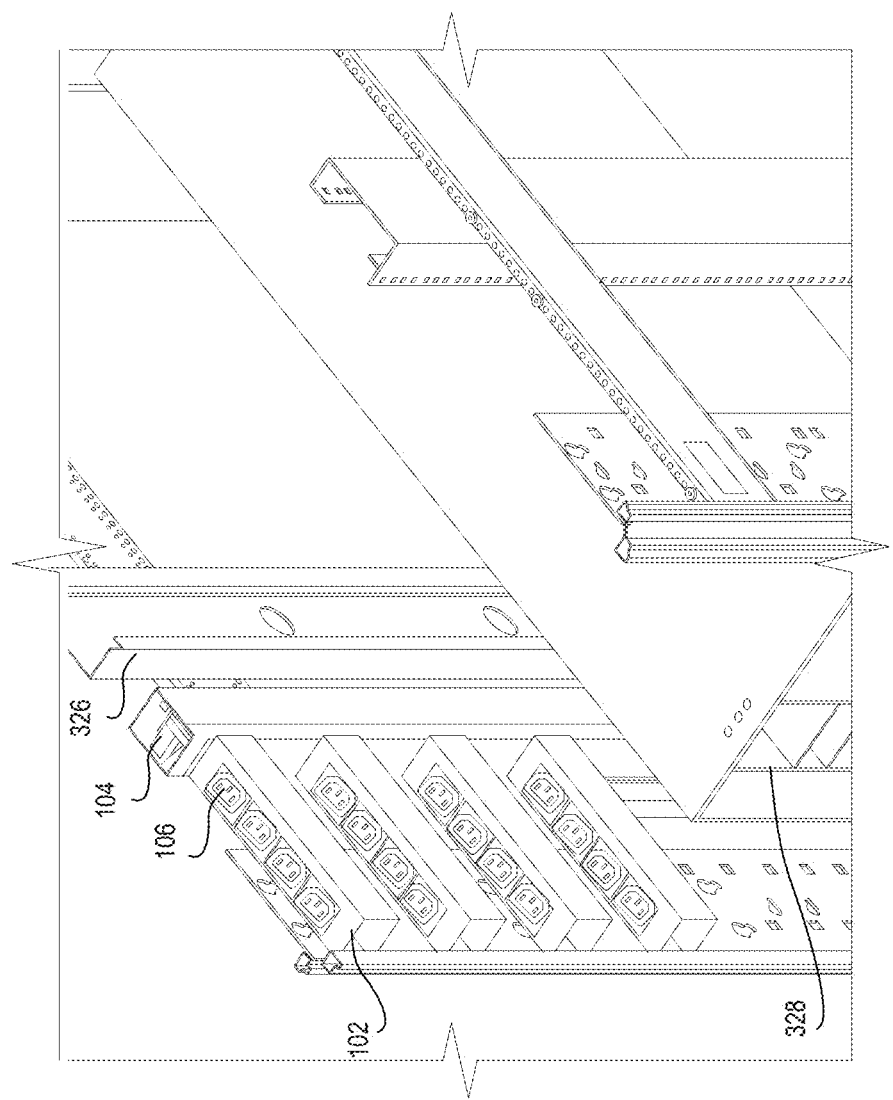
FIG. 3 illustrates a perspective views of an example power system including multiple power modules coupled to a PDU rack within a server rack in accordance with the present disclosure.

FIG. 3 illustrates an example power system in a server rack 326. The power system includes tiered receptacles of power modules 102 positioned perpendicularly to the PDU rack 104. Each power module 102 includes multiple power connectors 106 on a top portion to receive a power cable from a server 328. Upon coupling the power cable to the power connectors 106, power is distributed through the PDU rack 104 to the respective power module, through the power cable and to the server 328.

The server rack 326, also referred to as rack-mounted server, is the framework including multiple slots or bays, each intended to hold server 328. The server rack 326 is comprised of rails, walls, mounts, bars, infrastructure, and other supporting structure designed to hold multiple servers. As illustrated in FIG. 3, the PDU rack 104 is positioned in a vertical manner which aligns with a top and bottom of the server rack 326. The power modules 102 are positioned in a horizontal manner in the server rack 326 and parallel to one another. Each power module 102 is positioned perpendicularly to the PDU rack 104.

The server 328 is a networking device that manages networking resources, including data communications. Each server 328 includes a respective power cable (not illustrated) which is used to connect to the power connectors 106 on the power module 102. Accessing the power connectors 106 on each tiered rung on the power module 102, provides easier access for distributing power rather than routing power cables back to the PDU rack 104. As discussed in regards to the server rack 326, each server 326 includes a chassis which takes up much space, thus creating tight tolerances for routing the power cables. As such, each power module 102 provides flexible access and prevents stress on the bend radius of the power cables.

Figure 4B:
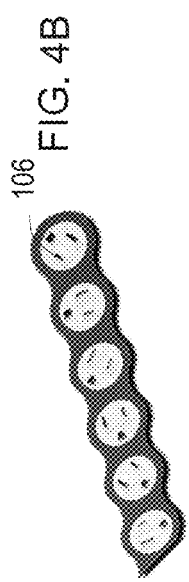
FIGS. 4A-4D illustrate perspective views of an example power system including power connectors which rotate at least 45 degrees in accordance with the present disclosure.
Figure 4C:
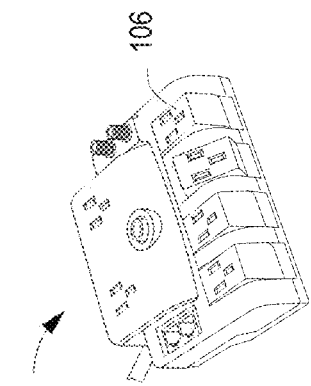
Figure 4D:
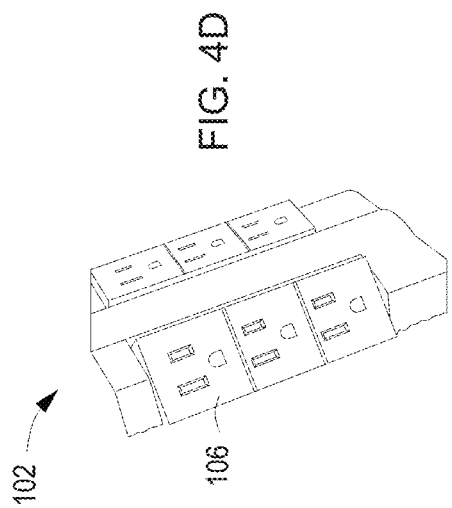

FIGS. 4A-4D illustrate various positions of rotation for power connectors 106 located on a top portion of power modules 102. The power system includes power modules 102 coupled to the PDU rack 104 within a server rack 326. Each of the power modules 102 include power connectors 106 which are rotated at least 45 degrees in various positions as illustrated in FIGS. 4B-4D.

Figure 4A:
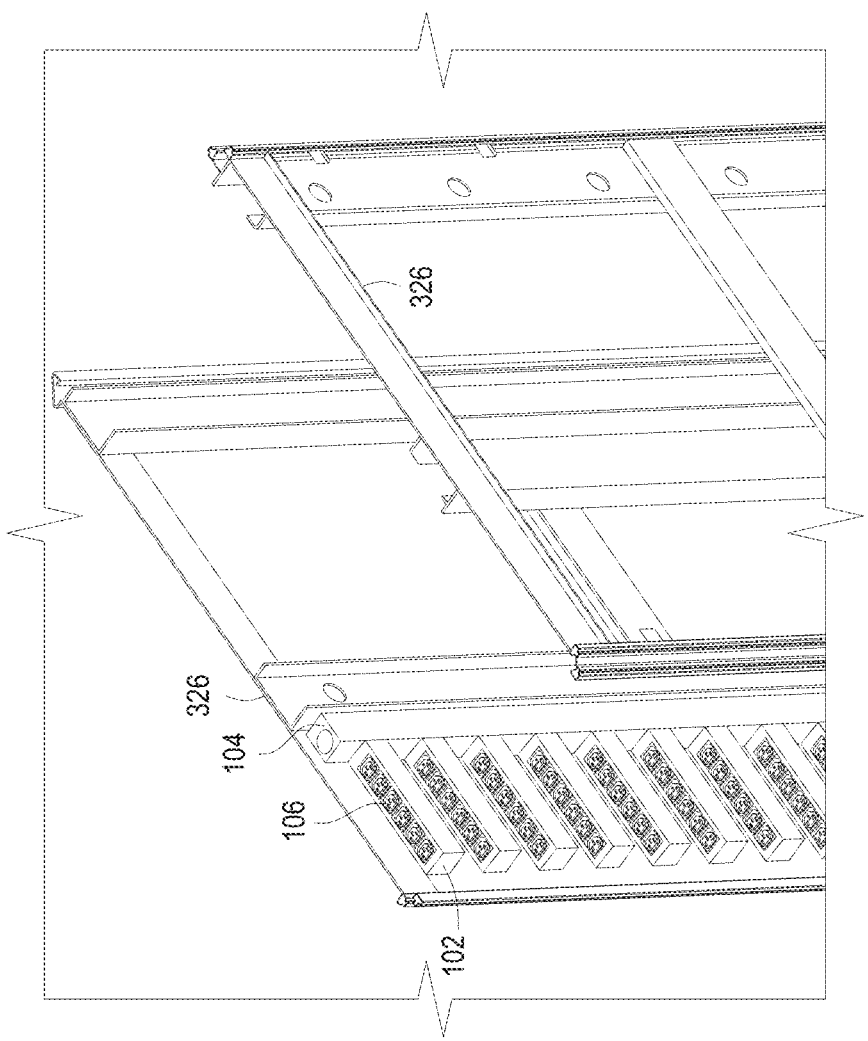

In FIG. 4A, the power system includes the power modules 102 coupled to the PDU rack 104 within the server rack 326. Each of the power modules 102 include power connectors 106 located on the top portion of the module 102. In this implementation, the power connectors 106 are in a first position facing towards the ceiling or top of the server rack 326. For example, the power connectors 106 may begin in this initial position and upon ingressing and egressing cables from the power connectors 106, the power connectors 106 are rotatable for easier access for the power cables.

FIGS. 4B-4D illustrate various rotation positions for the power connectors 106 on each power module 104C illustrates how 2. Specifically, FIG. 4B illustrates how each power connector 106 pivots within the socket to rotate. FIG. 4C illustrates how each power connector 106 on the power module 102 rotates at least 45 degrees. FIG. 4D illustrates how the full power module 102 rotates such that the power connectors 106 are rotated at least 45 degrees. These figures represent the various rotational positions for the power connectors 106 to improve plug access and power cable or cord routing to the power modules 102.

Figure 5:
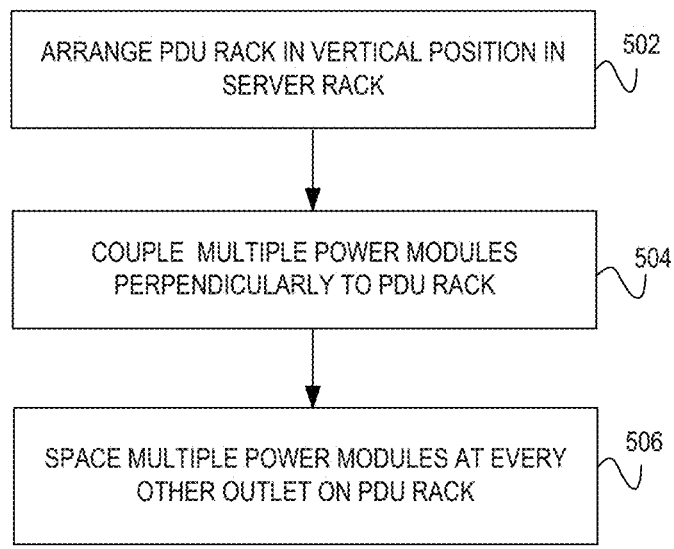

Referring now to FIGS. 5 and 6, flow diagrams are illustrated in accordance with various examples of the present disclosure. The flow diagrams represent processes that may be utilized in conjunction with various systems and devices as discussed with reference to the preceding figures. While illustrated in a particular order, the flow diagrams are not intended to be so limited. Rather, it is expressly contemplated that various processes may occur in different orders and/or simultaneously with other processes than those illustrated.

FIG. 5 is a flow diagram illustrating a method of manufacturing a power system in a server rack. The method is initiated at operation 502 to arrange a PDU rack vertically in the server rack. Arranging the PDU rack vertically in the server, allows a wall of outlets on the PDU rack to be in a position to accept a coupling with multiple power modules. Upon arranging the PDU rack, multiple power modules are coupled perpendicularly to the PDU rack. Each of the power modules include power connectors, such that when the power modules are coupled to the PDU rack, a number of the power connectors within the server rack increases. Increasing the number of power connectors allows for additional power loads from the servers installed within the rack. Upon the coupling of the power modules to the PDU rack, the power modules are spaced to couple to every other outlet on the PDU rack. Spacing to every other outlet on the PDU rack, provides an advantage for the server cables to reach the power modules in tightly constricted spaces. In discussing FIG. 5, operations 502-506 may be performed by components in FIGS. 1-4B. As such, references may be made to such components for purposes of clarification and not to limit such implementations. For example, the power module 102 may be coupled to the PDU rack 104 to construct the power system.

At operation 502, the method of manufacture is initiated though an arrangement of the PDU rack within the server rack. The PDU rack is a device fitted with multiple outlets or outputs designed to distribute electrical power. In this regard, the PDU rack includes an input to receive electrical power for distribution. The PDU rack distributes electrical power to the servers within the server rack via the multiple power modules. The PDU rack is arranged in the vertical position such that a side wall of multiple outlets face inward toward the server rack. The vertical position is a direction of top to bottom of the server rack, so both ends of the PDU rack align with the top and bottom of the server. Arranging the PDU rack in the vertical position aligns the multiple outlets for easy access to couple to the power modules. Coupling the power modules to the PDU rack, server power cables may easily access the power modules for power distribution.

At operation 504, the power modules are coupled perpendicularly to the PDU rack. Coupling each power module perpendicularly to the PDU rack, means each power module is arranged horizontally within the server rack. The horizontal direction is side to side (e.g., left to right and vice versa), so both ends of each power module align side to side of the server rack. Coupling each power module to the PDU rack means an inlet on the power module is inserted or plugged into the outlet on the PDU rack. Inserting or plugging the outlet into the PDU rack ensures an electrical connection between the power module and PDU rack. Ensuring the electrical connection allows for the power to flow from the PDU rack to each coupled power module for power distribution. Based on the coupling of the power modules the PDU rack, the power modules are parallel to one another. For example, each power module is parallel to the other power modules. Each power module includes multiple power connector so the coupling of each power module to the PDU rack increases a number of the power connectors available within the server rack.

At operation 506 upon the coupling of the power modules to the PDU rack, each of the power modules may be spaced at every other outlet on the PDU rack. In this regard, an outlet on the PDU rack t is left uncoupled between two power modules. Spacing the power modules to every other outlet on the PDU, allows for adequate space between two power modules. Allowing for adequate space, allows the power cables from the servers to route to the power modules. In one implementation, operation 506 may occur simultaneously to operation 504, so that upon one power module being coupled to the PDU rack, a subsequent power module is coupled and spaced so approximately one outlet is between both power modules.

FIG. 6 is a flowchart of an example method to manufacture a power system including a PDU rack and power module in a server rack. The method may be initiated by positioning a control module on an end of the power module. The method proceeds to arrange the PDU in a vertical position in the server rack for perpendicularly coupling multiple power modules. The power modules are plugged into outlets of the PDU rack, such that the power modules implement plug and play capabilities. Upon coupling the power modules to the PDU rack, each power module is spaced at every other outlet on the PDU rack. The method proceeds to rotate at least one of the power modules such that the power connectors rotate at least 45 degrees. In discussing FIG. 6 operations 602-612 may be performed by components in FIGS. 1-4B. As such, references may be made to such components for purposes of clarification and not to limit such implementations. For example, the power module 104 may be coupled to the PDU rack 102 to construct and manufacture the power system.

At operation 602, the control module is positioned on an end of the power module. The control module is a device installed in the power module which manages and controls the power being delivered through the power connectors to the servers. As such, the control module includes, by way of example, a circuit breaker to regulate power distribution to the servers within the server rack, a visual signal indicating an amount of power distributed to the multiple servers, and a controller to manage the amount of power being distributed. The control module is positioned on the end of the power module which is opposite to the end for coupling to the PDU rack. Installing and positioning to the control module within the power module, provides an intelligence aspect to the power module for power monitoring, etc.

At operation 604, the PDU rack is arranged in the vertical position within the server rack. Arranging the PDU rack in the vertical position means aligning each end of the PDU rack to align with the top and bottom of the server rack. Operation 604 may be similar in functionality to operation 502 as in FIG. 5.

At operation 606, the multiple power modules are coupled perpendicularly to the PDU rack. Each of the power module is coupled such that the power modules are horizontal to each other and perpendicular to the PDU rack. Each of the power modules includes multiple power connectors, so upon coupling each power module, increases the number of power connectors. This also creates horizontal tiers of power connectors. In one implementation, coupling the power modules to the PDU rack includes plugging each of the power modules into an outlet of the PDU rack. In a further implementation, the power modules spaced to every other outlet on the PDU rack. Operation 606 may be similar in functionality to operation 504 as in FIG. 5.

At operation 608, each of the power modules are plugged into the respective outlet on the PDU rack. Each of the power modules includes an inlet used to couple to one of the outlets on the PDU rack. In this implementation, each power module supports plug and play capabilities. Plug and play capabilities allow the power modules to couple to the PDU rack without regard to a specific order or arrangement of the coupling. In this manner, upon the plugging each power module into the PDU rack allows power distribution to the power modules from the PDU rack without additional action. Additionally, plugging the power module into one of the outlets of the PDU rack provides the ability that one power module may be replaced by another power module in the PDU rack without affecting the operation of the power system.

At operation 610, the power modules are spaced at every other outlet on the PDU rack. Spacing the power modules at every other outlet, the infrastructure of the power modules are parallel to one another and perpendicular to the PDU rack. Operation 610 may be similar in functionality to operation 506 as in FIG. 5.

At operation 612, the power connectors, located on at least one of the power modules, rotate at least 45 degrees. Rotating the power connectors at least 45 degrees decreases a bend radius of the power cables which connect to the power module. In one implementation, each of the power connectors located on the power module each rotate. In another implementation, the power module rotates which in turn rotates the power connectors.

Although certain embodiments have been illustrated and described herein, it will be greatly appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a variety of ways. This application is intended to cover adaptions or variations of the embodiments discussed herein. Therefore, it is manifestly intended that embodiments be limited only by the claims and equivalents thereof.

I claim:

1. A method comprising:
   arranging a power distribution unit (PDU) rack in a vertical position within a server rack;
   coupling multiple power modules perpendicularly to the PDU rack, wherein each of the multiple power modules includes multiple power connectors;
   spacing the multiple power modules at every other outlet on the PDU rack, wherein the multiple power modules are parallel to one another and perpendicular to the PDU rack; and
   rotating the multiple power modules such that the multiple power connectors located on each power module rotate at least 45 degrees.

2. The method of claim 1, further comprising:
   coupling power cables from multiple servers in the server rack to the multiple power connectors located on each power module.

3. The method of claim 1, wherein coupling the multiple power modules perpendicularly to the PDU rack comprises:
   plugging the multiple power modules into multiple outlets on the PDU rack, wherein each power module supports plug and play capability with the outlet.

4. The method of claim 1, further comprising:
   positioning a control module on an end of the power module opposite to the PDU rack.

* * * * *